United States Patent [19]

Muyshondt et al.

[11] Patent Number: 5,646,368
[45] Date of Patent: Jul. 8, 1997

[54] PRINTED CIRCUIT BOARD WITH AN INTEGRATED TWISTED PAIR CONDUCTOR

[75] Inventors: Jorge Enrique Muyshondt, Austin; Gary Parker, Round Rock; Bruce James Wilkie, Georgetown, all of Tex.

[73] Assignee: International Business Machines Corporation, Armonk, N.Y.

[21] Appl. No.: 565,373

[22] Filed: Nov. 30, 1995

[51] Int. Cl.⁶ .................................................. H05K 1/00
[52] U.S. Cl. .......................... 174/33; 174/261; 174/262; 174/250; 333/1; 333/238
[58] Field of Search .................................. 174/33, 34, 261, 174/262, 250; 333/1, 4, 238, 245

[56] References Cited

U.S. PATENT DOCUMENTS

| | | | |
|---|---|---|---|
| 3,757,028 | 9/1973 | Schlessel | 174/33 |
| 4,310,811 | 1/1982 | Currie | 333/1 |
| 4,967,344 | 10/1990 | Scavezze et al. | 364/200 |
| 5,036,160 | 7/1991 | Jackson | 174/33 |
| 5,039,824 | 8/1991 | Takashima et al. | 174/33 |
| 5,223,806 | 6/1993 | Curtis et al. | 333/12 |
| 5,278,524 | 1/1994 | Mullen | 333/1 |
| 5,389,735 | 2/1995 | Bokelman | 174/33 |

OTHER PUBLICATIONS

IBM Technical Disclosure bulletin, vol. 37 No. 06A Jun. 1994, p. 603 Printed Circuit Board Pattern Design Method for Low EMI Noise.

*Primary Examiner*—Laura Thomas
*Attorney, Agent, or Firm*—Volel Emile

[57] ABSTRACT

A multi-layered printed circuit board having an integrated twisted pair conductor. In a preferred embodiment, the printed circuit board comprises two segmented conductor traces on a first and a second layer of the printed circuit board crisscrossing each other and a plurality of vias. The two segmented conductor traces on the first layer are connected to the two segmented conductor traces on the second layer through the vias. The twisted pair conductor may be shielded by adding a ground trace on either side of the conductor traces and a ground plane both above and below the conductor traces. The conductor traces may also be tuned to specific electrical characteristics by properly spacing the plurality of vias such that a specific number of turns per unit length are achieved. The continuous conductor traces may be further tuned by using a specific dielectric thickness as well as by designing the conductor traces to be of a specific dimension.

8 Claims, 4 Drawing Sheets

PRINTED CIRCUIT BOARD WITH AN INTEGRATED TWISTED PAIR CONDUCTOR

BACKGROUND OF THE INVENTION

1. Field of the Invention

The present invention relates generally to printed circuit boards. More specifically, the invention relates to a multi-layer printed circuit board containing an integrated twisted pair conductor having the characteristics of a transmission line.

2. Description of the Related Art

It has recently been customary to design printed circuit boards with line conductors to transmit signals from one end of the boards to another. For example, U.S. Pat. No. 5,278,524, issued to Mullen, discloses the fabrication of a printed circuit board with a coax-like transmission line. The transmission line includes a narrow conductive strip surrounded by four constant voltage conductors. The conductors are spaced from the conductive strip by a dielectric layer. U.S. Pat. No. 4,310,811, issued to Currie, discloses a printed circuit board with external rework wires. The rework wires are part of a dedicated rework layer. The dedicated rework layer comprises a rework reference layer that is affixed to the printed circuit and an overlying network of wires that are semi-permanently affixed to the rework reference layer for facilitating the reconnection of components or overcoming defects in the buried signal layers. However, although these patents disclose fabricating a printed circuit board with line conductors, neither one discloses the fabrication of a printed circuit board with an integrated twisted pair conductor.

As is well known in the field of transmission lines, a twisted wire pair conductor (i.e., a twisted signal and return wire conductors) provides a simple way of reducing electromagnetic interference in a cable interconnecting two circuits. That is, the twisting of the wire conductors reduces the susceptibility of coupling external signals (e.g., noise signal) with the desired signal. It is also well known that a twisted wire pair conductor allows for the easy removal of external signals collected by a transmission line. For example, due to the signal and return wires being intertwined, any external signal collected by one wire is also collected by the other wire. Thus, a differential receiver can be used, at the receiving end of the twisted wire pair conductor to filter out the signal common in both wires (i.e., the collected external signal). It is further well known that the reduced loop area formed by the signal and return wires of a twisted pair conductor greatly minimizes magnetic coupling on the transmission line.

In the past, whenever it was desired to have two chips connected with a twisted wire pair conductor on a printed circuit board, an external twisted wire pair cable was used. The cable was soldered to the trace conductors on the printed circuit board leading to particular pins of the chips to be connected. This was a labor and time intensive project as the conductor traces on the printed circuit boards are thinly sized and closely spaced together. In addition, the cost of the electrical component system containing the printed circuit board with the interconnected chips was increased as the cost of the twisted wire cable was added to the cost of the overall system.

Moreover, whenever both analog and digital electrical components were used on the same printed circuit board, they were situated such that all the digital components were at one end of the board and all the analog components at the other end. This configuration was used to minimize the chance of introducing unwanted signals on the analog lines due to the switching of the digital components. Furthermore at times, two printed circuit boards were used to minimize the likelihood of introducing these noise signals in the system, one of the printed circuit board was used for the analog components and the other for the digital components. This arrangement increased the price of the electrical component system incorporating these printed circuit boards as two printed circuit boards were used instead of one.

Thus, there has been a long felt need in the art for a printed circuit board incorporating a twisted pair conductor for providing electrical connection between two electrical components.

SUMMARY OF THE INVENTION

The need in the art is addressed by the present invention. The present invention provides a twisted pair conductor system embedded within a multi-layered printed circuit board. In a preferred embodiment, the printed circuit board comprises two segmented conductor traces on a first and a second layer of the printed circuit board crisscrossing each other and a plurality of plated-through holes otherwise known as vias. The two segmented conductor traces on the first layer are connected to the two segmented conductor traces on the second layer through the vias to produce two continuous conductor traces. The twisted pair conductor may be shielded by adding a ground trace on either side of the conductor traces and a ground plane both above and below the conductor traces. The conductor traces may also be tuned to specific electrical characteristics by properly spacing the plurality of vias such that a specific number of turns per unit length are achieved. The continuous conductor traces may be further tuned by using a specific dielectric thickness as well as by designing the conductor traces to be of a specific dimension.

DESCRIPTION OF THE INVENTION

Figure 1:
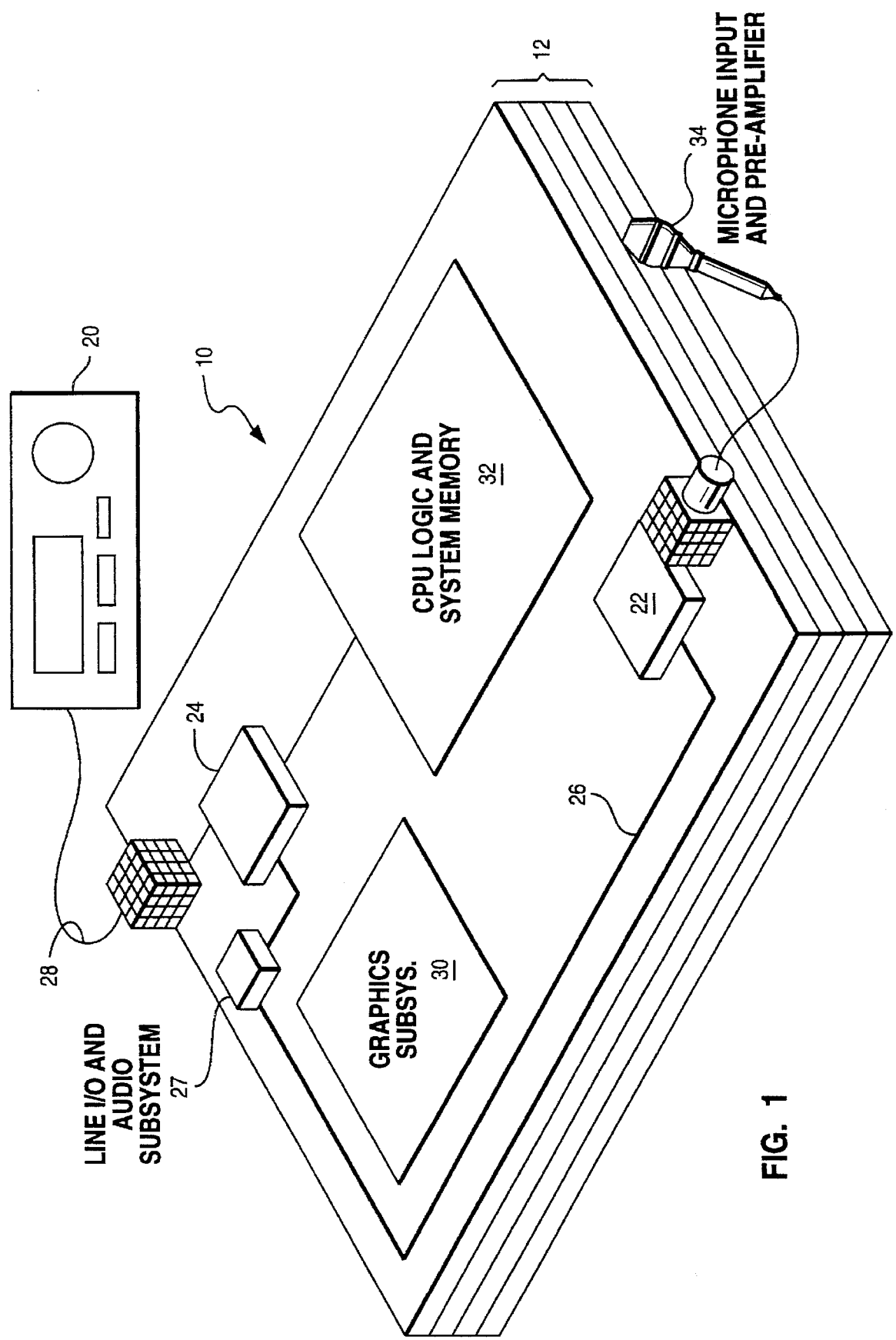
FIG. 1 is a printed circuit board incorporating the present invention.

The present invention may be used within printed circuit boards manufactured according to many types of manufacturing techniques. As an illustration, two types of printed circuit board manufacturing techniques will be described below.

A first manufacturing technique of printed circuit boards is called a laminate process. In the laminate process, a base core is first manufactured by pressing two sheets of copper foil together with an insulating epoxy glass mesh between the sheets to insulate the copper foil sheets from each other and to provide adhesion. At least one of the copper foil sheets is then etched to provide personalized circuitry. Multiple etched base cores are then laminated together into a finished laminate with insulating epoxy glass mesh between each of the base cores to provide insulation and adhesion. However, the outside copper foil layer of the outside base cores have usually not been etched.

Many holes are then drilled through the finished laminate at selected locations. The holes will be used for providing interconnect vias between the various copper layers. A smear remove is then used to clean the drilled laminate. Copper is then electrolytically plated onto the laminate to provide conductivity in the drill holes and to plate the outer surfaces. A subtractive etch process is then used to remove unwanted copper from the surfaces. The remaining copper is in the vias and at selected locations as traces and bonding pads. When the printed circuit board is used at a later stage for assembling devices to the board, pin-in-hole devices may then be soldered into the vias and surface mount devices may then be soldered to the bonding pads.

Prior to the device assembly process, a protective photosensitive dielectric is then placed on the outer surfaces of the laminate. This photosensitive dielectric, often referred to as soldermask, and may be Probimer 52 from Ciba-Geigy or one of many other chemicals used in the industry with the desired dielectric or photosensitive characteristics. The soldermask is then exposed by a collimated light source through a mask to polymerize the exposed areas. The exposed laminate is then developed to remove all the unexposed soldermask. This removal of unexposed soldermask provides for access to the bonding pads and the vias through the board. The resulting soldermask is then dried and cured, usually thermally. An epoxy ink is then used to print information such as a description of the devices to be placed on the printed circuit board surface. In a final step, a corrosion inhibiter such as Entek (copper triazole) by Enthone is then thinly sprayed over the outside surface of the printed circuit board. The printed circuit board is then ready for the trimming of the outside edges which were used for handling of the board and for assembly of the board with devices and soldering of those devices to the printed circuit board.

Another more recent technique known for manufacturing a printed circuit board is known as surface laminer circuitry. In this process, a base core of copper foil sheets surrounding an insulating epoxy glass mesh layer is etched to provide a personalized circuit on at least one of the copper surfaces. A photosensitive dielectric such as Probimer 52 is then coated over the etched copper. The photosensitive dielectric is then exposed and developed to remove the unexposed dielectric. The unexposed areas are often used to provide vias to the underlying copper circuitry. The exposed dielectric surface is then roughened to provide a capability of adhering copper to that surface. This roughening may be done by a combination of a mechanical scrub of the surface with a pumice paste and a swelling of the surface with a solvent. Another layer of copper is then electrolytically plated onto the roughened exposed dielectric and into the vias to the underlying circuit layers. That copper layer is then etched to provide a second layer of circuitry and vias to the lower layer. This process of adding photosensitive dielectric and copper may be repeated several times to provide multiple layers of circuitry.

The printed circuit board may then be drilled to provide additional vias to underlying circuitry. Again, the surface is roughened and copper plated to provide conductive vias in the drilled holes and to plate the outer surfaces. A subtractive etch process is then used to remove unwanted copper from the surfaces. The remaining copper is in the vias and at selected locations as traces and bonding pads. As described above, a protective photosensitive dielectric is then placed on the outer surfaces of the laminate, exposed, and developed to provide access to the bonding pads and the vias through the board. The resulting board is then dried and cured, usually thermally. An epoxy ink is then used to print information such as a description of the devices to be placed on the printed circuit board. A corrosion inhibiter such as Entek is then thinly spread over the outside surface of the printed circuit board.

Referring to FIG. 1, a printed circuit board, generally labeled 10, is shown incorporating the present invention. The printed circuit board may contain a number of layers as shown by layers 12. On the printed circuit board 10 may be located integrated chips 22 and 24 interconnected by way of twisted pair conductor 26. Chip 22 may be a pre-amplifier for amplifying a low level audio sound from a microphone 34 whereas chip 24 may be a digital-to-analog and analog-to-digital converter (DAC/ADC). Twisted pair conductor 26 may be located within the printed circuit board 10 at any of the different layers or at the top layer. Chip 24 may be connected to line input/output 28 which may be further connected to an external audio device 20. On printed circuit board 10 may be located a graphics subsystem 30 and a central processing unit (CPU) 32 having an integrated system memory.

As can be seen from FIG. 1, an audio sound from microphone 34 may be amplified by the pre-amplifier 22 and the analog signal from the pre-amplifier transmitted to external audio device 20 over twisted pair conductor 26. The amplified analog signal may also be converted to a digital signal by DAC/ADC 24 and the digital signal transmitted to CPU 32 to be recorded in the system memory. Or, a pre-recorded digital signal from the system memory may be converted to an analog signal by DAC/ADC 24 and transmitted to chip 22 over twisted pair conductor 26. Note that in this case, chip 22 may be an amplifier that may be further connected to a speaker. The analog signal may contain unwanted signals collected by the twisted pair conductor 26 from graphics subsystem 30 or CPU 32. Therefore, a differential receiver 27 may be used at either or both ends of the twisted pair conductor to filter out the unwanted signals.

Figure 2:
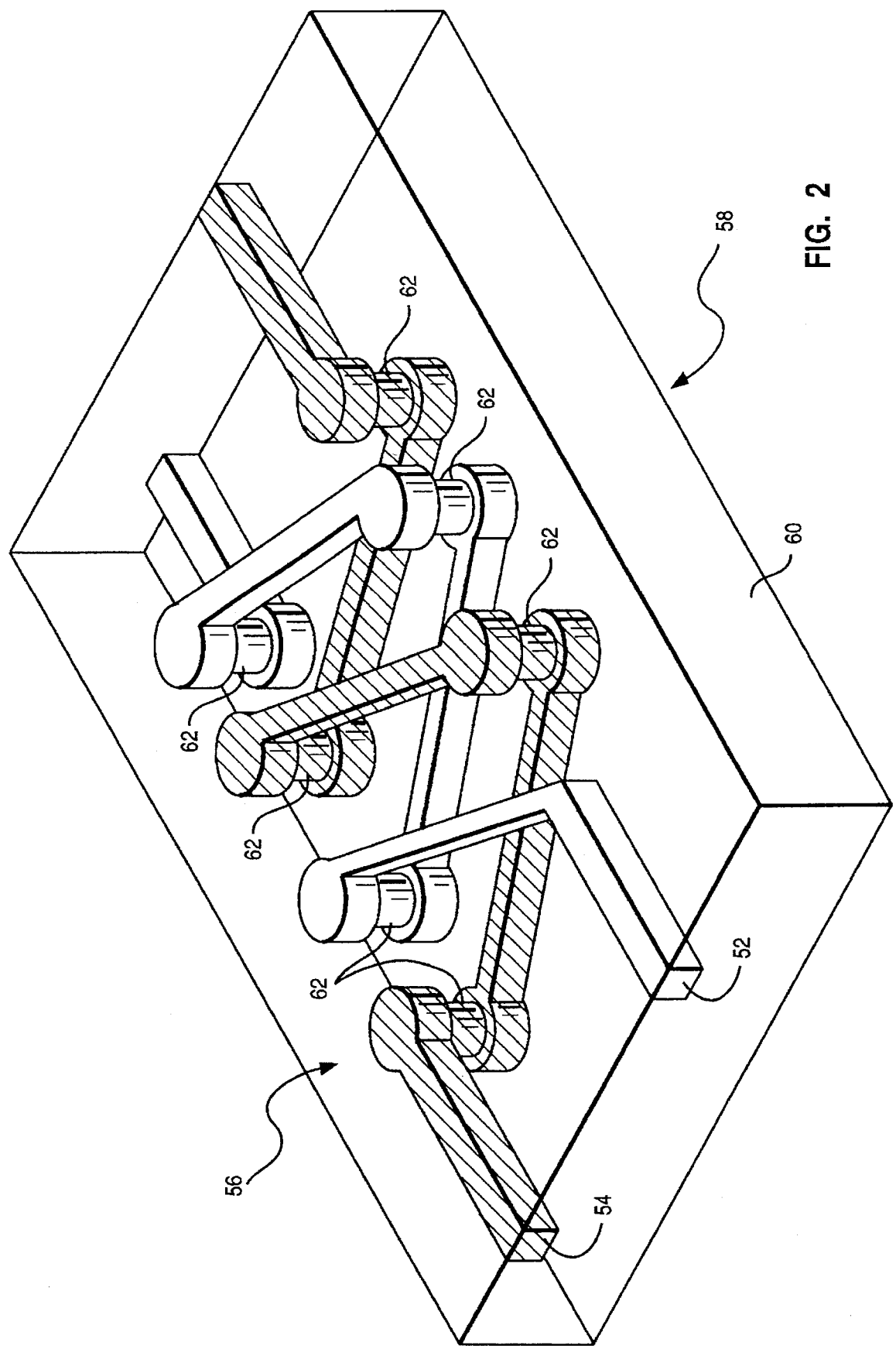
FIG. 2 is a schematic diagram of the invention.

FIG. 2 is a schematic diagram of the twisted pair conductor of the invention. The twisted pair conductor 26 comprises trace conductors 52 and 54. Trace conductors 52 and 54 may start at the same side or at different sides of the dielectric. In the preferred embodiment of the invention, trace conductors 52 and 54 start on the same side of the dielectric 60. Trace conductors 52 and 54 alternate from layer 56 to layer 58 of the dielectric 60. That is, when trace conductor 52 is on the top layer 56 of the dielectric, trace conductor 54 is on the bottom layer 58. The two traces 52 and 54 alternate from one layer of the dielectric to the other by going through vias 62. The two trace conductors 52 and 54 also crisscross each other to achieve the twisted result. Although trace conductors 52 and 54 are shown alternating between two adjacent layers, it should be understood that the traces may alternate between any number of layers of the multi-layer printed circuit board.

The dimension of the trace conductors, the number of turns per inch used in the twisted pair conductor and the spacing between layers may all be controlled to establish different electrical characteristics (e.g., frequency response). Note that, the number of turns per inch is obtained by varying the spacing between the vias (i.e., the vias may be spaced far apart or close together).

Figure 3:
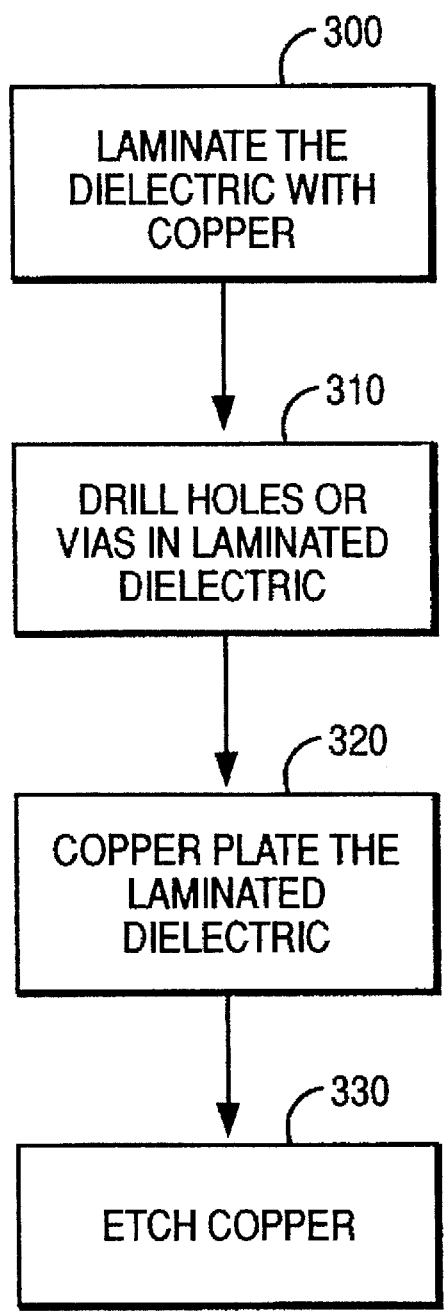
FIG. 3 is a flowchart illustrating the process of fabricating a twisted wire pair conductor.

FIG. 3 is a flowchart illustrating the process of making the twisted pair conductor 26. For the purpose of illustration, the first method described above is used. Furthermore, the process is described as if only a two layer printed circuit board was being manufactured. In a step 300, a dielectric is laminated on both sides with copper. As generally described above, this is achieved by pressing two thin sheets of copper foil together with an insulating epoxy glass mesh (or any other type of dielectric) between the sheets to insulate the copper foil sheets from each other and to provide adhesion. In step 310, holes are then drilled through the finished laminate at selected locations. The holes are used to provide interconnect vias between the top layer and the bottom layer of the dielectric. A smear remove is then used to clean the drilled laminate. In step 320, copper is then electrolytically plated onto the laminate to provide conductivity in the drilled holes and to plate the copper surfaces. At step 330, the copper surfaces are etched to provide the personalized circuitry of the twisted wire pair conductor.

Figure 4:
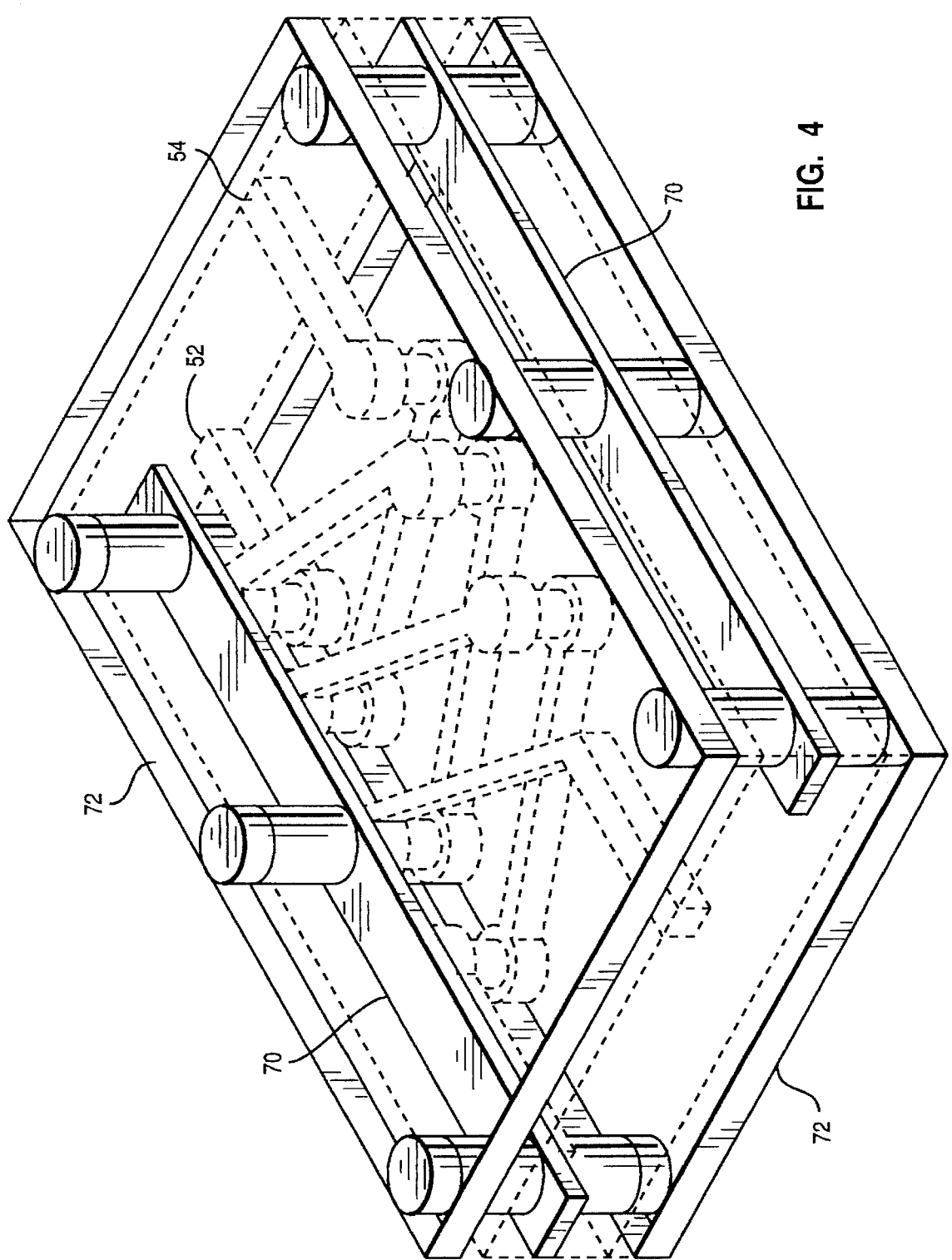
FIG. 4 is an illustration of a shielded twisted pair conductor.

As shown in FIG. 4, the twisted pair conductor may also be shielded. For example, in step 330 above, the copper surfaces may be additionally etched to provide ground traces 70 on either side of the twisted pair conductor. In addition, a ground plane 72 may be added on both the top and bottom layers of the dielectric. The ground planes 72 would be separated from the twisted pair conductor layers by a dielectric.

While the invention has been particularly shown and described with reference to the preferred embodiment thereof, it will be understood by those skilled in the art that changes in form and details may be made therein without departing from the spirit and scope of the invention.

What is claimed is:

1. A printed circuit board having a first and a second layer comprising:

at least two segmented conductor traces on the first and on the second layer crisscrossing each other;

a plurality of vias for connecting the at least two segmented conductor traces on the first layer to the at least two segmented traces on the second layer to form two continuous conductor traces;

a first ground plane atop the first layer and a second ground plane below the second layer; and a continuous ground trace on either side of said two continuous conductor traces for shielding said traces.

2. The printed circuit board of claim 1 further having a plurality of vias on either side of said two continuous traces for connecting said first ground plane to said second ground plane and to said ground traces on either side of said continuous traces.

3. A multi-layered printed circuit board for mounting and interconnecting a first and a second electronic component comprising:

means for mounting the first and the second electronic components;

means for interconnecting the first and the second electronic component including:

at least two segmented conductor traces on a first and on a second layer crisscrossing each other;

a plurality of vias for connecting the at least two segmented conductor traces on the first layer to the at least two segmented traces on the second layer to form two continuous conductor traces;

a first ground plane atop the first layer and a second ground plane below the second layer; and a continuous ground trace on either side of said two continuous conductor traces for shielding said traces.

4. The multi-layered printed circuit board of claim 3 further having a plurality of vias on either side of said two continuous traces for connecting said first ground plane to said second ground plane and to said ground traces on either side of said continuous traces.

5. The multi-layered printed circuit board of claim 4 further comprising a differential receiver coupled to the conductor traces and to the first electronic component to filter out noise signals collected by the conductor traces.

6. A method of fabricating a twisted pair conductor within a multi-layered printed circuit board comprising the steps of:

crisscrossing at least two segmented conductor traces on a first and on a second layer of the printed circuit board; and connecting the at least two segmented conductor traces on the first layer to the at least two segmented conductor traces on the second layer through a plurality of vies to form two continuous conductor traces;

placing a first ground plane atop the first layer and a second ground plane below the second layer; and placing a continuous ground trace on either side of said two continuous conductor traces for shielding said traces.

7. The method of claim 6 further comprising the step of placing a plurality of vias on either side of said two continuous traces for connecting said first ground plane to said second ground plane and to said ground traces on either side of said continuous traces.

8. The method of claim 7 further comprising the step of adding a differential receiver at the end of the conductor traces to filter out noise signals.

* * * * *